United States Patent
Derfiora

(10) Patent No.: US 8,198,890 B2
(45) Date of Patent: Jun. 12, 2012

(54) METHOD FOR DETERMINATION OF A PARAMETER SET WHICH DESCRIBES ELECTRICAL PARAMETERS OF A TRACK SECTION OF A MAGNETIC LEVITATION RAILROAD

(75) Inventor: Rizqa Derfiora, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 405 days.

(21) Appl. No.: 12/597,625

(22) PCT Filed: Apr. 26, 2007

(86) PCT No.: PCT/DE2007/000784
§ 371 (c)(1),
(2), (4) Date: Oct. 26, 2009

(87) PCT Pub. No.: WO2008/131707
PCT Pub. Date: Nov. 6, 2008

(65) Prior Publication Data
US 2010/0148750 A1   Jun. 17, 2010

(51) Int. Cl.
*G01B 7/14* (2006.01)
*B60L 13/06* (2006.01)

(52) U.S. Cl. ......... 324/207.26; 324/207.11; 324/207.22; 324/260; 104/284; 318/135

(58) Field of Classification Search ............. 324/207.15, 324/207.26, 207.11, 207.25, 207.24, 166, 324/117 R, 262, 244, 225, 260, 252, 228, 324/207.22; 104/281, 282, 284; 310/90.5, 310/12.09, 156.38; 318/135
See application file for complete search history.

(56) References Cited

U.S. PATENT DOCUMENTS

| 6,087,790 | A | * | 7/2000 | Fischperer | ............... 318/135 |
| 8,085,037 | B2 | * | 12/2011 | Schmid | ............... 324/207.26 |
| 2002/0053912 | A1 | | 5/2002 | Saha et al. | |
| 2007/0262737 | A1 | * | 11/2007 | Hoffmann et al. | ............ 318/135 |

FOREIGN PATENT DOCUMENTS

| DE | 10253865 A1 | 6/2004 |
| EP | 1172660 A2 | 1/2002 |
| GB | 1057896 A | 2/1967 |

* cited by examiner

*Primary Examiner* — Huy Q Phan
*Assistant Examiner* — Son Le
(74) *Attorney, Agent, or Firm* — Laurence A. Greenberg; Werner H. Stemer; Ralph E. Locher

(57) ABSTRACT

In a method for determining a parameter set describing electric parameters of a route section of a magnetic suspension railway, the route section contains a stator section forming a drive section of the magnetic suspension railway and a route cable connecting the stator section to an associated converter device. In the method, the current and voltage values are measured at the electric connecting point between the route cable and the converter device. The parameters of the parameter set are determined using the measurement values, thus forming the parameter set. Accordingly, the current and voltage values are additionally measured at the electrical connecting point between the route cable and the stator section and the current values at the neutral point side of the stator section, if the stator section is electrically connected to the route cable. The additional measurement values are also considered when determining the parameters.

21 Claims, 4 Drawing Sheets

METHOD FOR DETERMINATION OF A PARAMETER SET WHICH DESCRIBES ELECTRICAL PARAMETERS OF A TRACK SECTION OF A MAGNETIC LEVITATION RAILROAD

BACKGROUND OF THE INVENTION

Field of the Invention

The invention relates to a method having the features according to the precharacterizing clause of claim 1.

In order to control a magnetic levitation railroad, in particular in order to regulate the thrust force current of a magnetic levitation railroad, it is necessary to know as accurately as possible the electrical parameters of the individual track sections of the magnetic levitation railroad.

It is known from the Transrapid track built in Shanghai for a corresponding parameter set to be determined for each track section. In this case, a track section comprises at least one stator section, which forms a drive section of the magnetic levitation railroad, and a track cable, which connects the stator section to an associated converter device. In order to determine the parameter set, the current and voltage values are measured at the electrical connection point between the track cable and the converter device. These measured values are then used to determine the parameters of the parameter set, and therefore to form the parameter set. The already known procedure for determination of the parameters is illustrated in a simplified form in FIG. 1.

FIG. 1 shows a stator section 10, one of whose connections 20 is connected via a switch Se to a track cable A and to a further track cable B. The stator section connection 30 of the stator section 10 is connected to the star point via a switch Ss.

The track cable A is connected by means of its feed connection 40 via switches Sua and Ska to a converter device URA. The further track cable B is connected by means of its feed connection 50 via switches Sub and Skb to a further converter device URB.

Measurements are taken at the feed connection 40 and at the feed connection 50 in order to determine the parameters of the track section, using a converter-related measurement device 60 and a further converter-related measurement device 70, which, for example, can be connected to an evaluation device 90 via current regulation 80 for the magnetic levitation railroad. During the measurement at the feed connection 40, the switches Se and Sub are open, and the voltages Ua and the currents Ia are measured for an open track cable end (Skb open) and a closed track cable end (Skb closed). During the measurement at the feed connection 50, the switches Se and Sua are open and the voltages Ub and the currents Ib are measured for an open track cable end (Ska open) and a closed track cable end (Ska closed). The corresponding measured values are used to determine the electrical parameters of the two track cables A and B. The characteristics of the stator section 10 are then calculated back from current measured values of the currents Ia and Ib and measured values of the voltages Ua and Ub, which are determined with the switch Se closed. Back-calculation such as this is possible since the characteristics of the two track cables A and B are already known, separately from the stator section 10, at this time.

The already known method has the disadvantage that the measurements must be carried out with extreme care in order to prevent damage to the converter devices URA and URB. In the case of the short-circuit measurement, that is to say when the switches Ska or Skb are closed, short-circuit currents with very high harmonic components can flow, which can in some circumstances lead to destruction of the semiconductor valves contained in the converter devices.

BRIEF SUMMARY OF THE INVENTION

Against the background of a method of the type mentioned initially, the invention is based on the object of specifying a method for parameter determination, in which the risk of damage to the converter devices is avoided, or at least considerably reduced.

According to the invention, this object is achieved by a method having the features as claimed in claim 1. Advantageous refinements of the method according to the invention are specified in dependent claims.

The invention accordingly provides that the current and voltage values are measured at the electrical connection point between the track cable and the converter device when the stator section is electrically connected to the track cable, and in addition the current and voltage values are measured at the electrical connection point between the track cable and the stator section, and the current values are measured on the star point side of the stator section, and these additional measured values are likewise taken into account in determination of the parameters.

One major advantage of the method according to the invention is that the risk of damage to the converter devices is relatively low; because of the stator section, which is connected in parallel during the measurements, the current harmonic components are shifted to a different frequency, and the natural frequencies of the electrical overall system are distributed considerably better in comparison to a measurement with the stator section disconnected. The short-circuit measurements with switches Ska and Skb closed therefore correspond to electrical states as can occur during normal operation of the magnetic levitation railroad, as a result of which the risk of destruction of the converter devices while the parameters are being determined is relatively low.

The parameters can be determined particularly easily and therefore advantageously when the measured values are evaluated with the aid of the four-pole theory.

As already mentioned initially, the stator section can be connected via a further track cable to a further converter device: In this case, it is considered to be advantageous for the current and voltage values likewise to be measured at the electrical connection point between the further track cable and the further converter device when the stator section is switched on, and for these measured values to be additionally taken into account in determination of the parameters.

One or more of the following parameters are preferably determined for the parameter set: the electrical resistance, the inductance, the capacitance, the electrical resistance per unit length, the inductance per unit length, the susceptance per unit length, the capacitance per unit length and/or the conductance, be this for the track cable, the further track cable and/or the stator section.

The current and voltage values are in each case preferably measured on three phases at the electrical connection point between the track cable and the converter device, and the current and voltage values are in each case measured on three phases at the electrical connection point between the track cable and the stator section, and are evaluated on a phase-conductor-specific basis.

The current and voltage values are recorded at the electrical connection point between the track cable and the stator section, and the current values are recorded on the star point side of the stator section by means of a mobile measurement device, and are transmitted to a stationary evaluation device, by means of which the parameters are then determined.

Alternatively, the current and voltage values can be recorded at the electrical connection point between the track cable and the stator section, and the current values can be recorded on the star point side of the stator section by means of a stationary measurement device, and transmitted to a stationary evaluation device, by means of which the parameters are then determined.

After the determination of the parameters, the current and voltage values are measured at least one more time, preferably repeatedly, at the electrical connection point between the track cable and the converter device, the current and voltage values are measured at least one more time, preferably repeatedly, at the electrical connection point between the track cable and the stator section, and the current values are measured at least one more time, preferably repeatedly, on the star point side of the stator section during operation of the magnetic levitation railroad, in order to determine the parameters which result from each of the measured values and to use the respectively up-to-date parameters to update the parameter set.

It is considered to be particularly advantageous if the current and voltage values at the electrical connection point between the track cable and the stator section are also used to determine the position of a vehicle on the stator section during operation of the magnetic levitation railroad. In addition the current values on the star point side of the stator section are preferably also used for determination of the position of the vehicle.

It is also considered to be advantageous if the measured star point current is considered to be approximately equal to the stator current underneath a vehicle which is located on the stator section, and to set the thrust force current of the magnetic levitation railroad on the basis of this assumption.

The invention also relates to an arrangement for determination of a parameter set which describes electrical parameters of a track section of a magnetic levitation railroad, wherein the track section comprises a stator section, which forms a drive section of the magnetic levitation railroad, and a track cable which connects the stator section to an associated converter device, wherein the arrangement has a converter-related measurement device which is connected to the electrical connection point between the track cable and the converter device and measures the current and voltage values at the connection point during its operation, and wherein the arrangement has an evaluation device, which is connected to the converter-related measurement device and uses the measured values from the converter-related measurement device to determine the parameters of the parameter set, and therefore to form the parameter set.

For an arrangement such as this, the invention provides that the arrangement additionally has one stator-related measurement device which is connected on the input side to the electrical connection point between the track cable and the stator section and to the star point side of the stator section, and is connected on the output side to the evaluation device, wherein the stator-related measurement device is designed such that, during its operation, it measures the current and voltage values at the connection point between the track cable and the stator section and the current values on the star point side, and transmits these to the evaluation device, wherein the evaluation device is designed such that it additionally takes account of the measured values of the stator-related measurement device in the determination of the parameters and carries out the measurements when the stator section is electrically connected to the track cable.

The arrangement preferably has a further converter-related measurement device, which is connected on the input side to the electrical connection point between a further track cable and a further converter device, and is connected on the output side to the evaluation device, and is designed such that, during its operation, it measures the current and voltage values at the connection point between the further track cable and the further converter device, and transmits these to the evaluation device.

The stator-related measurement device may be formed by a mobile unit or by a stationary unit. The evaluation device may be a component of a mobile or stationary unit such as this, or may form a separate component.

The arrangement is preferably designed such that, after determination of the parameters, it measures the current and voltage values at the electrical connection point between the track cable and the converter device, the current and voltage values at the electrical connection point between the track cable and the stator section, and the current values on the star point side of the stator section during operation of the magnetic levitation railroad, at least once more, and preferably repeatedly, it determines the parameters which result from each of the measured values, and uses the respectively up-to-date parameters to update the parameter set.

In addition, the evaluation device may also be designed such that it uses the current and voltage values at the electrical connection point between the track cable and the stator section during operation of the magnetic levitation railroad to determine the position of a vehicle on the stator section.

In addition, the current values on the star point side of the stator section can also be used to determine the position of the vehicle.

Furthermore, a magnetic levitation railroad having a multiplicity of track sections is considered to be inventive, wherein at least one of the track sections, preferably all of the track sections, is or are each equipped with an individual, local arrangement—as described—in order to determine a parameter set, and wherein the thrust force current of the track section is in each case determined for each track section which is provided with a local arrangement, using its locally determined parameter set.

Furthermore, an arrangement and a method for location of a vehicle on a track section of a magnetic levitation railroad are considered to be an autonomous invention, to be precise independently of how the parameters and parameter sets have been determined for the magnetic levitation railroad.

Furthermore, an arrangement and a method for adjusting the thrust force current for a vehicle which is located on a track section of a magnetic levitation railroad is regarded as an autonomous invention, in which the star point current of the stator section is regarded as the stator current underneath the vehicle, and is used to adjust the thrust force current.

The invention will be explained in more detail in the following text with reference to exemplary embodiments, and in this case, by way of example:

DESCRIPTION OF THE INVENTION

For clarity reasons, the same reference symbols are used for identical or comparable components in FIGS. 1 to 5.

Figure 1:
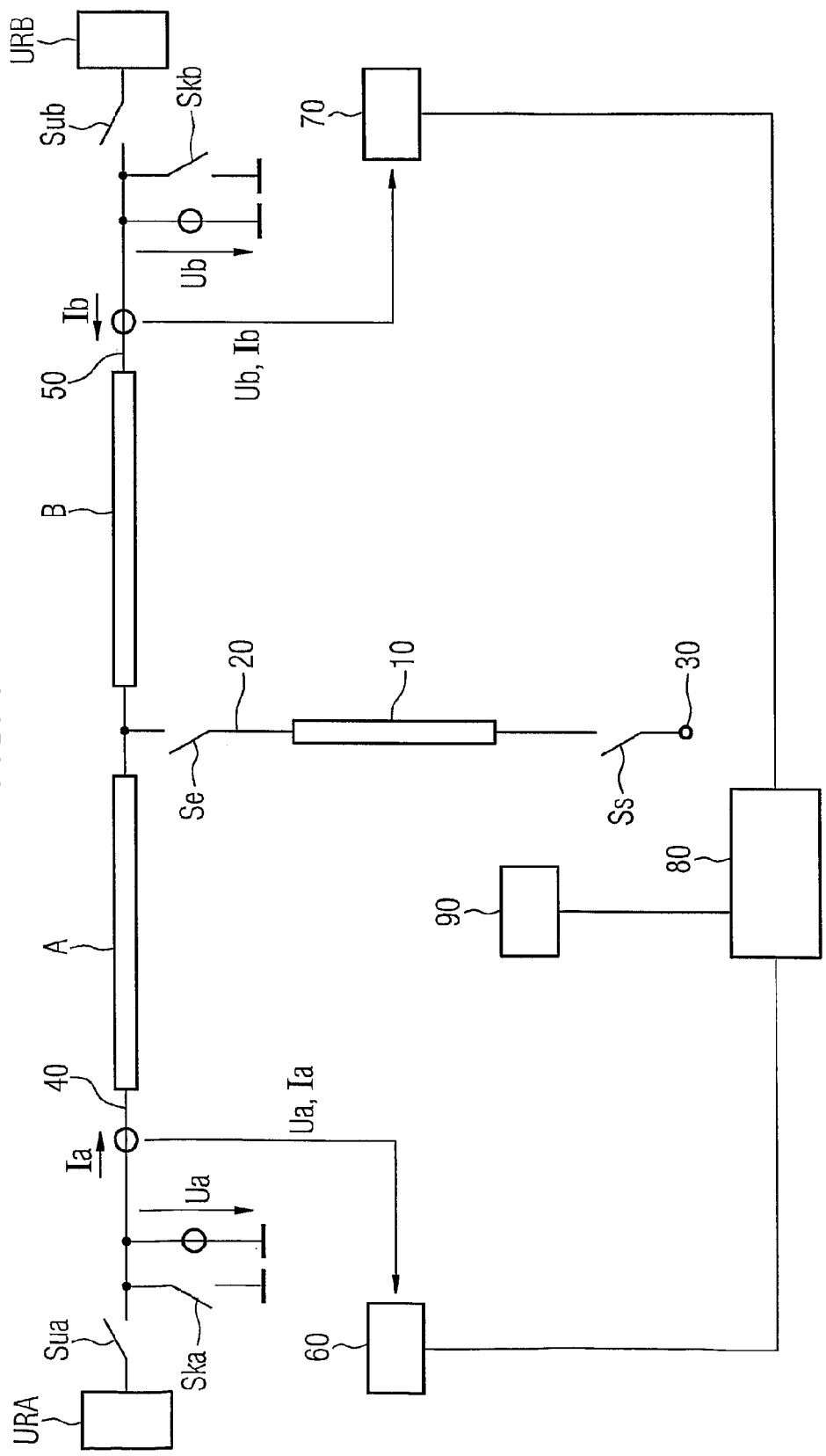
FIG. 1 is an illustration for understanding a method for determining parameters according to the prior art.
Figure 2:
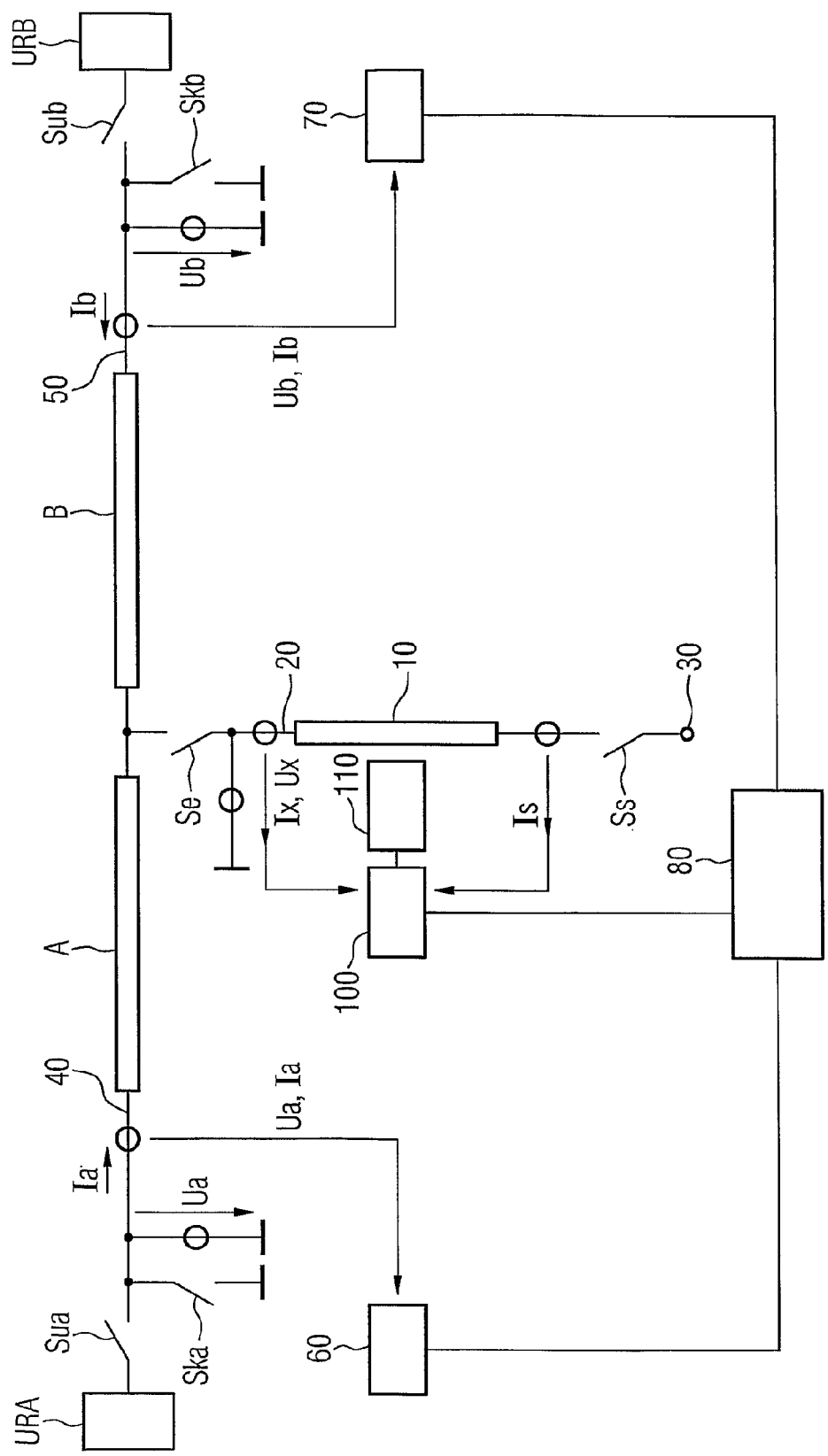
FIG. 2 shows one exemplary embodiment of an arrangement according to the invention, on the basis of which the method according to the invention will also be explained by way of example.

FIG. 2 shows one exemplary embodiment of an arrangement according to the invention. Corresponding to the arrangement shown in FIG. 1, this arrangement has a stator section 10, a track cable A, a further track cable B, a plurality of switches Se, Ss, Sua, Ska, Sub and Skb, a converter device URA, a further converter device URB, a converter-related measurement device 60, a further converter-related measurement device 70 and current regulation 80 for the magnetic levitation railroad.

In addition, in the arrangement shown in FIG. 2, a stator-related, mobile or stationary measurement device is provided, is annotated with the reference symbol 100 and is electrically connected on the input side to the connection point 20 between the two track cables A and B and the stator section 10, and to the star point side 30 of the stator section. On the output side, the stator-related measurement device 100 is connected to an evaluation device 110. The stator-related measurement device 110 is designed such that, during operation, it measures the current and voltage values Ix, Ux at the connection point 20 between the track cables A, B and the stator section 10, as well as the star point current values, Is on the star point side 30, and transmits these to the evaluation device 110.

In the exemplary embodiment shown in FIG. 2, the evaluation device 110 is connected only indirectly via the stator-related measurement device 100 to the two converter-related measurement devices 60 and 70, as a result of which the converter-related measurement results Ia, Ib, Ua, Ub from the converter-related measurement devices 60 and 70 can be passed to the evaluation device 110 only via the stator-related measurement device 100. Alternatively, the evaluation device 110 can also be connected to one of the two converter-related measurement devices 60 or 70, and can receive the measurement results from the other measurement devices via them. It is likewise possible to in each case connect the evaluation device 110 to all the measurement devices 60, 70 and 100 directly, thus allowing direct transmission of the measurement results.

The arrangement shown in FIG. 2 may be operated, for example, as follows:

The converter-related measurement device 60 is used to measure the current Ia flowing into the track cable A, and the voltage Ua applied to the track cable A. The further converter-related measurement device 70 is used to measure the current Ib flowing into the further track cable B, and the voltage Ub applied to the further track cable B. The stator-related measurement device 100 is used to measure the current Ix and the voltage Ux at the electrical connection point 20 between the track cables A, B and the stator section 10, as well as the current Is on the star point side of the stator section 10.

The evaluation device 110 uses these measurement results to determine the electrical parameters of the two track cables A and B, as well as those of the stator section 10, using the four-pole theory, as will be explained in detail in the following text.

The electrical characteristics of a long track cable or of a long stator section can be represented mathematically using the four-pole theory as follows:

$$\begin{pmatrix} I_1 \\ I_2 \end{pmatrix} = \begin{pmatrix} Y_{11} & Y_{21} \\ Y_{21} & Y_{22} \end{pmatrix} \begin{pmatrix} U_1 \\ U_2 \end{pmatrix} \quad \text{Equation 1}$$

Figure 3:
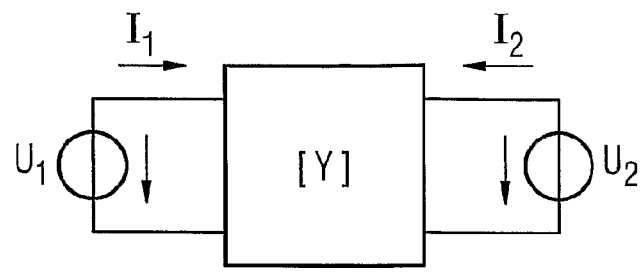
FIG. 3 shows general explanations relating to the four-pole theory.

The voltages U1 and U2 are, of course, the stimuli, and the currents I1 and I2 are the responses thereto. The voltages and currents are complex and may, for example, be represented using the αβ representation, which can be derived from the three-phase system representation (R, S and T). $Y_{ij}$ are admittances which are dependent on the frequency (s-domain according to Laplace). Schematically, the four-pole theory can be visualized as illustrated in FIG. 3. The conductance matrix is referred to as [Y]. The structure of the conductance matrix of a track cable and of a stator section with a length L are in this case identical:

The diagonal admittance is given by:

$$Y_{11} = Y_{22} = Y_D = \frac{1}{Z_w \tanh(\gamma L)} \quad \text{Equation 2}$$

and the parallel admittance is given by:

$$Y_{12} = Y_{21} = Y_C = -\frac{1}{Z_w \sinh(\gamma L)} \quad \text{Equation 3}$$

The conductance matrix of a track cable or of a stator section as shown in equations 2 and 3 is completely symmetrical.

$Z_w$ forms the wave impedance, where:

$$Z_w = \sqrt{\frac{R' + sL'}{G' + sC'}} \quad \text{Equation 4}$$

and γ is the propagation constant:

$$\gamma = \sqrt{(R'+sL')(G'+sC')}. \quad \text{Equation 5}$$

In this case:
R' is the resistance per unit length (Ω/m),
L' is the inductance per unit length (H/m),
G' is the susceptance per unit length ($\Omega^{-1}$/m) and
C' is the capacitance per unit length (F/m).

Important characteristics of the equations 2 and 3 are obtained as follows:

$$Y_D^2 - Y_C^2 = \frac{1}{Z_w^2} \Rightarrow Z_w = \frac{1}{\sqrt{Y_D^2 - Y_C^2}} \quad \text{Equation 6}$$

$$\frac{Y_D}{Y_C} = -\cosh(\gamma L) \Rightarrow \gamma = \frac{1}{L} \mathrm{acosh}\left(-\frac{Y_D}{Y_C}\right) \quad \text{Equation 7}$$

$Z_w$ and γ can be derived from $Y_D$ and $Y_C$.

The impedance per unit length is calculated in the following manner:

$$Z = \gamma \cdot Z_w = R' + sL' \quad \text{Equation 8}$$

The admittance per unit length is calculated as follows:

$$Y = \frac{\gamma}{Z_w} = G' + sC' \quad \text{Equation 9}$$

The following relationships can also be derived from equation 6 and equation 7, using s=jω:

The resistance per unit length is the real component of the impedance per unit length:

$$R' = Re(Z)$$

The inductance per unit length is the imaginary component of the impedance per unit length:

$$L' = \frac{1}{\omega} Im(Z) \quad \text{Equation 11}$$

The susceptance per unit length is the real component of the admittance per unit length:

$$G' = Re(Y) \quad \text{Equation 12}$$

The capacitance per unit length is the imaginary component of the admittance per unit length:

$$C' = \frac{1}{\omega} Im(Y) \quad \text{Equation 13}$$

If the characteristics of the diagonal and parallel admittances of a track cable or of a stator section are known (as a function of the frequency), then the characteristics of the electrical parameters per unit length R', L' G' and C' are also known, provided that the length L of the track cable or of the stator section is known, for example because it has been measured in advance.

The characteristics of the diagonal and parallel admittances as a function of the frequency can be determined by means of various measurements (e.g. voltage stimuli during commissioning) as a function of the frequency.

The purpose of determination of R', L', G' and C' is to derive models for the two track cables A, B and the stator section 10. By way of example, the models are used for current regulation of the magnetic levitation railroad.

The process of determining parameters during the commissioning of a magnetic levitation railroad (without a vehicle) will be explained in more detail in the following text using the example of the arrangement shown in FIG. 2.

Figure 4:
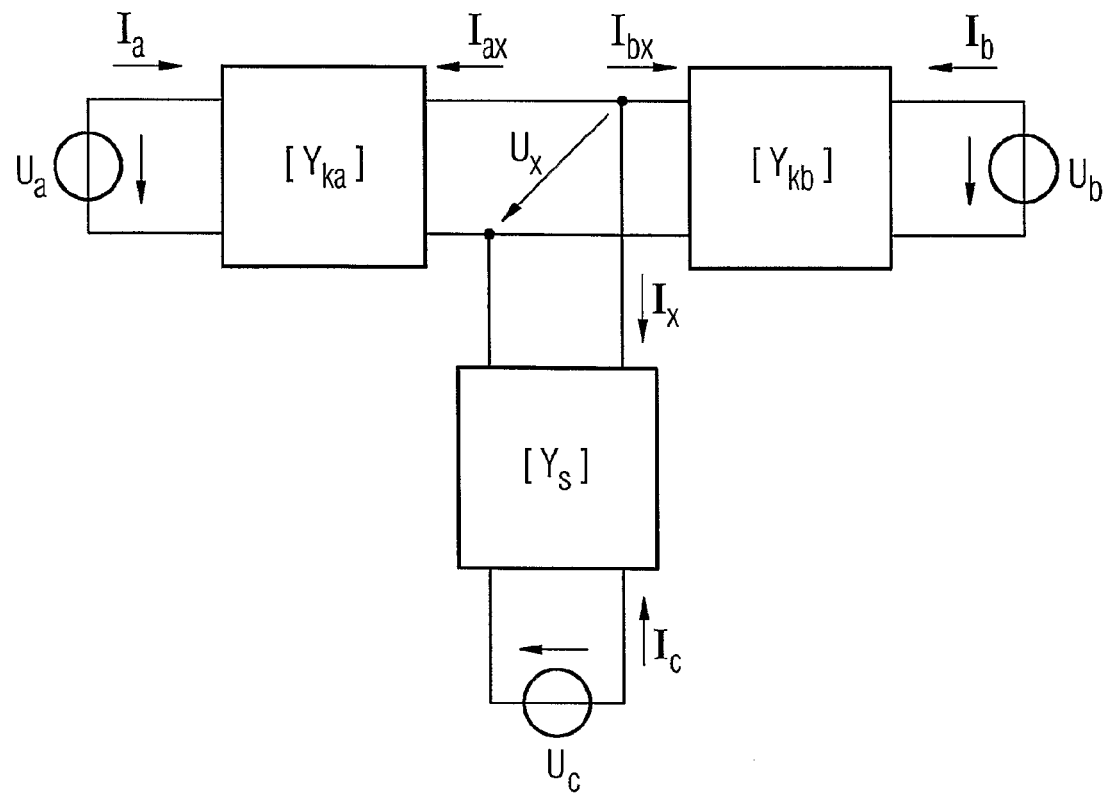
FIG. 4 shows the four-pole theory applied to the arrangement shown in FIG. 2.

The four-pole representation, which has been explained in a general form with reference to FIG. 3, is in this case applied to the arrangement shown in FIG. 2; this is shown in FIG. 4. The switches Se, Ss, Sua, Ska, Sub and Skb are not shown in FIG. 4; the switches Se and Ss are assumed to be switched on.

It is also assumed that the stator current Ic on the stator section 10 corresponds to the star point current Is of the stator section 10; this approximation applies very accurately at low frequencies up to 350 Hertz.

The following four-pole equations are applicable:
Track cable A:

$$\begin{pmatrix} I_c \\ I_{ax} \end{pmatrix} = \begin{pmatrix} Y_{Da} & Y_{Ca} \\ Y_{Ca} & Y_{Da} \end{pmatrix} \begin{pmatrix} U_a \\ U_x \end{pmatrix} \quad \text{Equation 14}$$

Track cable B:

$$\begin{pmatrix} I_b \\ I_{bx} \end{pmatrix} = \begin{pmatrix} Y_{Db} & Y_{Cb} \\ Y_{Cb} & Y_{Db} \end{pmatrix} \begin{pmatrix} U_b \\ U_x \end{pmatrix} \quad \text{Equation 15}$$

Stator section:

$$\begin{pmatrix} I_x \\ I_c \end{pmatrix} = \begin{pmatrix} Y_{Ds} & Y_{Cs} \\ Y_{Cs} & Y_{Ds} \end{pmatrix} \begin{pmatrix} U_x \\ U_c \end{pmatrix} \quad \text{Equation 16}$$

$$I_x = -(I_{ax} + I_{bx}) \quad \text{Equation 17}$$

R', L', G' and C' of the stator section 10 are determined by the evaluation device 110 during the commissioning process (without a vehicle), by means of the feed from the converter device URA and/or from the further converter device URB. When the switches Se and Ss are closed and there is no vehicle on the stator section 10, then, from equation 16:

$$I_x = Y_{Ds} U_x \Rightarrow Y_{Ds} = \left(\frac{I_x}{U_x}\right)_{Uc=0} = \frac{1}{Z_{ws}\tanh(\gamma_s L_s)} \quad \text{Equation 18}$$

$$I_c = Y_{Cs} U_x \Rightarrow Y_{Cs} = \left(\frac{I_c}{U_x}\right)_{Uc=0} = -\frac{1}{Z_{ws}\sinh(\gamma_s L_s)} \quad \text{Equation 19}$$

According to equations 6 to 13, the values $R_s'$, $L_s'$, $G_s'$ and $C_s'$ of the stator section can thus be calculated analytically, and unambiguously.

The stray resistance of the stator section is calculated as follows:

$$R_\sigma = R'_s \cdot L_s \quad \text{Equation 20}$$

The stray inductance of the stator section is calculated as follows:

$$L_\sigma = L'_s \cdot L_s \quad \text{Equation 21}$$

The stray resistance $R_\sigma$ and the stray inductance $L_\sigma$ may be used, for example, for calculation and determination of pole wheel voltage UC during operation of the stator section 10 with a vehicle; this will be explained in more detail further below.

The values R', L', G' and C' of the track cables A and B are determined during the commissioning process (without a vehicle), by way of example as follows:

The switches Sub and Ska are opened, and the switch Sua is closed; the feed is provided via the converter device URA:

1. When the switch Skb is closed (short-circuit measurement), $U_b=0$ and, from equation 1:

$$I_b = Y_{Cb} U_x \Rightarrow Y_{Cb} = \left(\frac{I_b}{U_x}\right)_{Ub=0} = -\frac{1}{Z_{wb}\sinh(\gamma_b L_b)} \quad \text{Equation 22}$$

2. When the switch Skb is open (no-load measurement), $I_b=0$ and, from equation 1:

$$I_b = 0 \quad \text{Equation 23}$$

$$= Y_{Db} U_b + Y_{Cb} U_x \Rightarrow \frac{Y_{Db}}{Y_{Cb}}$$

$$= -\left(\frac{U_x}{U_b}\right)_{Ib=0}$$

$$= -\cosh(\gamma_b L_b)$$

$Y_{Db}$ is derived from equations 22 and 23, as a result of which, according to equations 6 to 13, the values $R_b'$, $L_b'$, $G_b'$ and $C_b'$ of the track cable B can be determined analytically and unambiguously, provided that its length $L_b$ is known.

The parameters of the track cable A can be determined by a corresponding measurement by the further converter device URB, provided that its length $L_a$ is known. The two track cables A and B are preferably identical.

The only variable which cannot be measured directly in equation 14 is the current $I_{ax}$. However, this can nevertheless be determined because it can be derived from equations 15 and 17:

$$I_{ax} = -(I_x + I_{bx}) = -(I_x + Y_{Db} \cdot U_x + Y_{Cb} \cdot U_b) \qquad \text{Equation 24}$$

The admittances $Y_{Db}$ and $Y_{Cb}$ are calculated in advance from equations 22 and 23. Since the currents and the voltages in equation 12 are now known, the components of the conductance matrix $[Y_a]$, specifically $Y_{Da}$ and $Y_{Ca}$ can likewise be determined. The values $R_a'$, $L_a'$, $G_a'$ and $C_a'$ for the track cable A are therefore also obtained from equations 6 to 13.

A mathematical model for the two track cables A and B and for the stator section 10 can now be created using the values R', L', G' and C', and can be used for current regulation for the magnetic levitation railroad.

In some circumstances, the configuration of the track cable may be more complicated than is illustrated in FIGS. 1 and 2. Nevertheless, the four-pole theory is always valid and applicable. For example, the symmetry according to equation 2 may no longer be satisfied ($Y_{11} \neq Y_{22}$). Equation 3, which states that the parallel conductances are identical, is still valid, however ($Y_{12} = Y_{21}$). In general, the following equations are always valid.

$$\begin{pmatrix} I_a \\ I_{ax} \end{pmatrix} = \begin{pmatrix} Y_{Daa} & Y_{Ca} \\ Y_{Ca} & Y_{Dax} \end{pmatrix} \begin{pmatrix} U_a \\ U_x \end{pmatrix} \qquad \text{Equation 25}$$

$$\begin{pmatrix} I_b \\ I_{bx} \end{pmatrix} = \begin{pmatrix} Y_{Dbb} & Y_{Cb} \\ Y_{Cb} & Y_{Dbx} \end{pmatrix} \begin{pmatrix} U_b \\ U_x \end{pmatrix} \qquad \text{Equation 26}$$

$$\begin{pmatrix} I_x \\ I_c \end{pmatrix} = \begin{pmatrix} Y_{Ds} & Y_{Cs} \\ Y_{Cs} & Y_{Ds} \end{pmatrix} \begin{pmatrix} U_x \\ U_c \end{pmatrix} \qquad \text{Equation 27}$$

$$I_x = -(I_{ax} + I_{bx}) \qquad \text{Equation 28}$$

The parameters can therefore be determined unambiguously by means of the measured values from the three measurement devices 60, 70 and 100.

With a vehicle located on it, the stator section 10 behaves slightly differently than during commissioning without a vehicle. The electrical characteristics of the stator section 10 with a vehicle can be approximated very accurately, using the following model, for frequencies below 350 Hz:

$$\begin{pmatrix} U_c \\ I_c \end{pmatrix} = \begin{pmatrix} 1 & -(R_\sigma + sL_\sigma) \\ sC(x) & -1 \end{pmatrix} \begin{pmatrix} U_x \\ I_x \end{pmatrix} \qquad \text{Equation 29}$$

In this case as well, it is approximately true that the stator current $I_c$ corresponds to the star point current $I_s$ of the stator section 10, approximately (<350 Hz), $$I_c = I_s \qquad \text{Equation 30}$$

Figure 5:
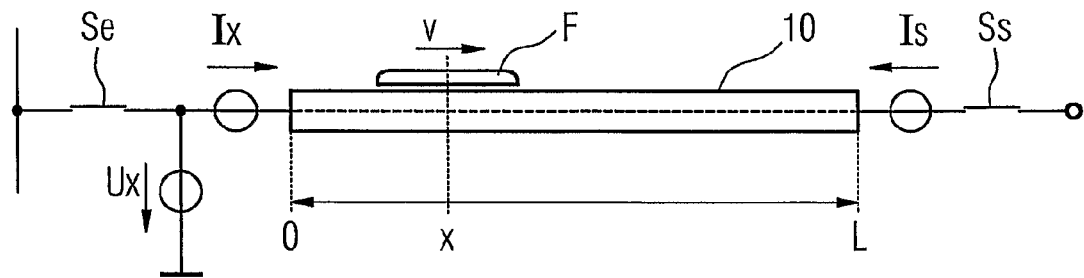
FIG. 5 shows schematically, the process of finding the position of a vehicle which is located on a stator section of the arrangement as shown in FIG. 2.
Figure 5:
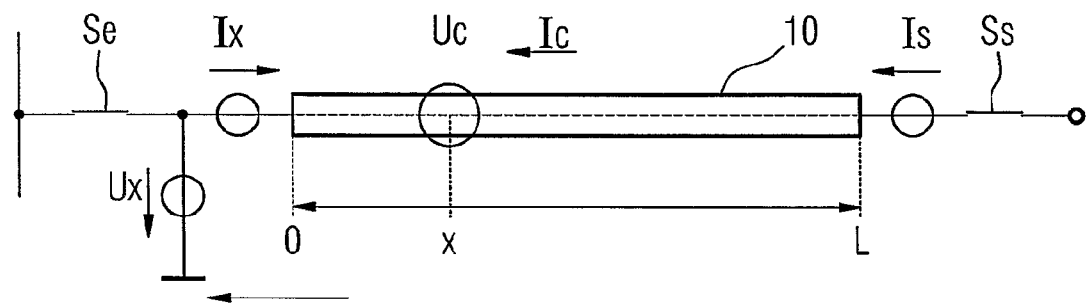
Figure 5:
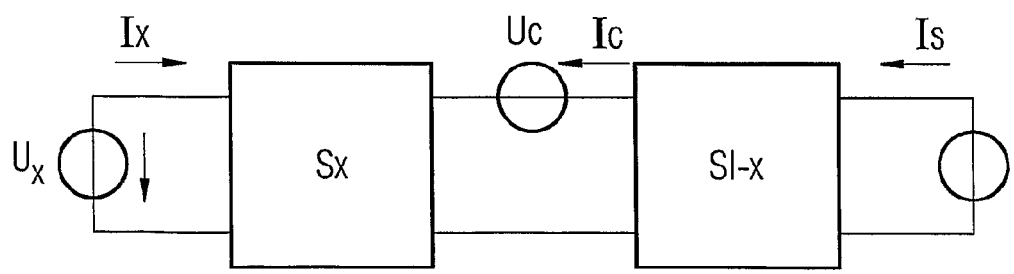

FIG. 5 shows the stator section 10 with a vehicle F traveling at a speed v, and which vehicle F is currently at a relative position x on the stator section 10. The vehicle F can be represented electrically as a point voltage Uc. The point voltage corresponds to the pole wheel voltage Uc of the stator section, and cannot be measured directly, however, it can be calculated as follows, $$U_c = U_x - (R_\sigma + sL_\sigma) \cdot I_x \qquad \text{Equation 31}$$

It is assumed that $U_c$ forms a pure sinusoidal voltage; in this case, a harmonic model of the stator section can be derived from equation 31, $$0 = U_{x,harm} - (R_\sigma + sL_\sigma) \cdot I_{x,harm} \Rightarrow \frac{U_{x,harm}}{I_{x,harm}} = (R_\sigma + sL_\sigma) \qquad \text{Equation 32}$$

The stray resistance $R_\sigma$ and the stray inductance $L_\sigma$ can then be determined by means of this harmonic model, as is described in the document "Sensorless Control of a 2.4 MW Linear Motor for launching roller-coasters" (EPE 2003-Toulouse (ISBN: 90-75815-07-7), Authors: Andre Veltman, Paul van der Hulst, Marco C. P. Jonker, Jan P. van Gurp).

In the case of a complicated track cable configuration, the following relationship can also be derived by means of the equations 25, 26 and 28:

$$\begin{pmatrix} I_a \\ I_b \\ I_x \end{pmatrix} = \begin{pmatrix} Y_{Daa} & 0 & Y_{Ca} \\ 0 & Y_{Cb} & Y_{Dbb} \\ -Y_{Dax} & -Y_{Dbx} & -(Y_{Ca} + Y_{Cb}) \end{pmatrix} \begin{pmatrix} U_a \\ U_b \\ U_x \end{pmatrix} \qquad \text{Equation 33}$$

In equation 33, all the measurable variables ($I_a$, $I_b$, $I_x$, $U_a$, $U_b$ and $U_x$) are combined in a single equation. The conductance matrix is now a 3×3 matrix (3 equations). The six unknown conductances ($Y_{Daa}$, $Y_{Dax}$, $Y_{Ca}$, $Y_{Dbb}$, $Y_{DBx}$ and $Y_{Cb}$) can easily be determined since at least six equations are available. The six equations may be created, for example, by measuring the currents and the voltages at two different sampling times, since the currents and the voltages vary over time.

Furthermore, measurements at a plurality of sampling times also statistically improve the parameter estimation quality.

The problem in equation 36 can also be generalized using the following formulation:

$$I = YU \qquad \text{Equation 34}$$

or $$e = I - \hat{Y}U \qquad \text{Equation 35}$$

In this case, I denotes a current vector, U a voltage vector, e an error vector (vector with the dimension 3×1), Y a real conductance matrix and $\hat{Y}$ an estimated conductance matrix (matrix with the dimension 3×3).

A cost function J can be defined, for example, as follows:

$$J = \sum_{i=1}^{N} e^T \cdot e = \sum_{i=1}^{N} (I - \hat{Y}U)^T \cdot (I - \hat{Y}U) \qquad \text{Equation 36}$$

This formulation is a known problem representation (according to Gauβ), where N denotes the number of measurements at a plurality of sampling times. There are a large number of methods for solving the equation 36, for example by minimizing J.

The position x of the vehicle F as shown in FIG. 5 can moreover likewise be determined, to be precise using:

$$x = \frac{1}{j\omega C'_s} \frac{Ix + Is}{Ux} \quad \text{Equation 37}$$

where Cs' denotes the capacitance per unit length of the stator section 10. The equation 37 can be used during operation of the magnetic levitation railroad, when the two switches Se and Ss are closed.

When the two switches Se and Ss are open, the position x can be determined via the pole wheel angle Φ of the voltage Uc by measuring the phase angle of the voltage Ux; this is because Ux and Uc have the same phase angle and are accordingly collinear:

$$Uc = \left(l\frac{x}{Ls}\right) Ux$$

In this case, the phase angle of Ux is therefore measured, the pole wheel angle Φ of the voltage Uc is determined using the phase angle of Ux, and the location of the vehicle calculated using the pole wheel angle Φ.

LIST OF REFERENCE SYMBOLS

10 Stator section
20 Connection
30 Star point
40 Feed connection
50 Feed connection
60 Converter-related measurement device
70 converter-related measurement device
80 Current regulation
90 Evaluation device
100 Stator-related measurement device
110 Evaluation device
A, B Track cable
Se Switch
Ss Switch
Sua Switch
Ska Switch
Sub Switch
Skb Switch
URA Converter device
URB Further converter device

The invention claimed is:

1. A method for determining a parameter set describing electrical parameters of a track section of a magnetic levitation railroad, the track section having a stator section forming a drive section of the magnetic levitation railroad, and a track cable connecting the stator section to a converter device, which comprises the steps of:
    measuring current and voltage values at a first electrical connection point between the track cable and the converter device resulting in measured values;
    measuring current and voltage values measured at a second electrical connection point between the track cable and the stator section, where further current values are measured on a star point side of the stator section when the stator section is electrically connected to the track cable resulting in additional measured values including a measured star point current; and
    taking account of the measured values and the additional measured values for determining parameters of the parameter set, and therefore to form the parameter set.

2. The method according to claim 1, wherein the stator section is connected via a further track cable to a further converter device, and the method further comprises:
    measuring current and voltage values at a third electrical connection point between the further track cable and the further converter device resulting in further measured values; and
    taking account of the further measured values for determining the parameters.

3. The method according to claim 2, which further comprises determining at least one of the following as a parameter: electrical resistance, inductance, capacitance, electrical resistance per unit length, inductance per unit length, susceptance per unit length, capacitance per unit length and conductance of at least one of the track cable, the further track cable and of the stator section.

4. The method according to claim 1, which further comprises:
    measuring the current values and the voltage values in each case on three phases at the first electrical connection point between the track cable and the converter device;
    measuring the current values and the voltage values in each case on three phases at the second electrical connection point between the track cable and the stator section; and
    evaluating the measured values and the additional measured values on a phase-conductor-specific basis.

5. The method according to claim 1, which further comprises:
    recording the current values and the voltage values at the second electrical connection point between the track cable and the stator section;
    recording the further current values on the star point side of the stator section via a mobile measurement device; and
    transmitting the further current values, the current values and the voltage values to one of a mobile evaluation device and a stationary evaluation device, by means of which the parameters are determined.

6. The method according to claim 1, which further comprises:
    recording the current values and the voltage values at the second electrical connection point between the track cable and the stator section;
    recording the further current values on the star point side of the stator section via a stationary measurement device; and
    transmitting the further current values, the current values and the voltage values to one of a mobile evaluation device and a stationary evaluation device, by means of which the parameters are determined.

7. The method according to claim 1, which further comprises:
    after a determination of the parameters, measuring the current values and the voltage values at least one more time at the first electrical connection point between the track cable and the converter device during operation of the magnetic levitation railroad;
    measuring the current values and the voltage values at least one more time at the second electrical connection point between the track cable and the stator section during operation of the magnetic levitation railroad;
    measuring the further current values at least one more time on the star point side of the stator section during operation of the magnetic levitation railroad;

determining the parameters which result from each of the measured values and the additional measured values; and using the parameters, being up to date, to update the parameter set.

8. The method according to claim 1, which further comprises using the current values and the voltage values measured at the second electrical connection point between the track cable and the stator section to determine a position of a vehicle on the stator section during operation of the magnetic levitation railroad.

9. The method according to claim 8, which further comprises using the further current values on the star point side of the stator section for determining the position of the vehicle.

10. The method according to claim 1, which further comprises using the measured star point current as a stator current of the stator section.

11. The method according to claim 1, which further comprises using the parameters to adjust a thrust force current for a vehicle which is located on the stator section.

12. The method according to claim 7, which further comprises:
after a determination of the parameters, measuring the current values and the voltage values repeatedly, at the first electrical connection point between the track cable and the converter device during operation of the magnetic levitation railroad;
measuring the current values and the voltage values repeatedly at the second electrical connection point between the track cable and the stator section during operation of the magnetic levitation railroad; and
measuring the further current values repeatedly on the star point side of the stator section during operation of the magnetic levitation railroad.

13. A configuration for determining a parameter set describing electrical parameters of a track section of a magnetic levitation railroad, the track section containing a stator section forming a drive section of the magnetic levitation railroad, and a track cable connecting the stator section to a converter device, the configuration comprising:
a converter-related measurement device connected to an electrical connection point between the track cable and the converter device and measures current and voltage values at the electrical connection point during operation resulting in measured values;
an evaluation device coupled to said converter-related measurement device and uses the measured values from said converter-related measurement device to determine parameters of the parameter set, and therefore to form the parameter set;
a stator-related measurement device having an input side connected to an electrical connection point between the track cable and the stator section and to a star point side of the stator section, and an output side connected one of directly and indirectly to said evaluation device, said stator-related measurement device configured such that, during operation, said stator-related measurement device measures current and voltage values at the connection point between the track cable and the stator section and further current values on the star point side resulting in further measured values, and transmits the further measured values to said evaluation device; and
said evaluation device configured such that said evaluation device additionally takes account of the further measured values of said stator-related measurement device in the determination of the parameters and carries out measurements when the stator section is electrically connected to the track cable.

14. The configuration according to claim 13, further comprising a further converter-related measurement device being one of indirectly and directly connected on an input side to an electrical connection point between a further track cable and a further converter device, and is one of indirectly and directly connected on an output side to said evaluation device, said further converter-related measurement device is configured such that, during operation, said further converter-related measurement device measures current and voltage values at the connection point between the further track cable and the further converter device, and transmits the current values and the voltage values to said evaluation device.

15. The configuration according to claim 13, wherein at least one of said stator-related measurement device and said evaluation device is formed as a mobile unit.

16. The configuration according to claim 13, wherein at least one of said stator-related measurement device and said evaluation device is formed as a stationary unit.

17. The configuration according to claim 13, wherein:
said evaluation device is configured such that, after determination of the parameters, said evaluation device measures the current values and the voltage values at the electrical connection point between the track cable and the converter device, the current values and the voltage values at the electrical connection point between the track cable and the stator section, and the further current values on the star point side of the stator section during operation of the magnetic levitation railroad, at least once more;
said evaluation device determines the parameters which result from each of the measured values and the further measured values; and
said evaluation device uses the parameters to update the parameter set.

18. The configuration according to claim 13, wherein said evaluation device is configured such that said evaluation device uses the current values and the voltage values at the electrical connection point between the track cable and the stator section during operation of the magnetic levitation railroad to determine a position of a vehicle on the stator section.

19. The configuration according to claim 18, wherein said evaluation device is configured such that said evaluation device additionally uses the further current values on the star point side of the stator section to determine the position of the vehicle.

20. The configuration according to claim 18, wherein said evaluation device is configured such that, after the determination of the parameters, said evaluation device measures the current values and the voltage values at the electrical connection point between the track cable and the converter device, the current values and the voltage values at the electrical connection point between the track cable and the stator section, and the further current values on the star point side of the stator section during operation of the magnetic levitation railroad repeatedly.

21. A magnetic levitation railroad, comprising:
a multiplicity of track sections each having a stator section forming a drive section of the magnetic levitation railroad, a converter device, a track cable connecting said stator section to said converter device, and a local configuration for determining a parameter set describing electrical parameters of a track section, said local configuration containing:

a converter-related measurement device connected to an electrical connection point between said track cable and said converter device and measures current and voltage values at the electrical connection point during operation resulting in measured values;

an evaluation device connected to said converter-related measurement device and uses the measured values from said converter-related measurement device to determine parameters of the parameter set, and therefore to form the parameter set;

a stator-related measurement device having an input side connected to an electrical connection point between said track cable and said stator section and to a star point side of said stator section, and an output side connected one of directly and indirectly to said evaluation device, said stator-related measurement device configured such that, during operation, said stator-related measurement device measures the current and voltage values at the connection point between said track cable and said stator section and the current values on the star point side resulting in further measured values, and transmits the further measured values to said evaluation device;

said evaluation device configured such that said evaluation device additionally takes account of the further measured values of said stator-related measurement device in the determination of the parameters and carries out measurements when said stator section is electrically connected to the track cable; and a thrust force current of said track section is in each case determined for each said track section provided with said local configuration, using a locally determined parameter set.

* * * * *